(12) United States Patent
Mitsui et al.

(10) Patent No.: US 6,769,963 B2
(45) Date of Patent: Aug. 3, 2004

(54) IC HANDLER AND CONTACT CLEANING METHOD

(75) Inventors: Tadashi Mitsui, Tokyo (JP); Tohru Tanaka, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 306 days.

(21) Appl. No.: 09/995,228

(22) Filed: Nov. 27, 2001

(65) Prior Publication Data

US 2002/0065026 A1 May 30, 2002

(30) Foreign Application Priority Data

Nov. 29, 2000 (JP) ........................................ 2000-363753

(51) Int. Cl.[7] .............................................. B07C 5/344
(52) U.S. Cl. ........................... 451/41; 451/56; 209/573; 209/905; 324/158 F; 414/404; 414/416
(58) Field of Search ...................... 451/41, 56; 209/573, 209/571, 905, 936; 414/404, 416, 225; 324/158 F

(56) References Cited

U.S. PATENT DOCUMENTS 5,150,797 A * 9/1992 Shibata ....................... 209/573
5,247,247 A * 9/1993 Kase .......................... 324/158.1
5,805,472 A * 9/1998 Fukasawa .................... 702/118
5,865,319 A * 2/1999 Okuda et al. ................ 209/574
6,218,852 B1 * 4/2001 Smith et al. ................. 324/761
6,657,031 B1 * 12/2003 Crane et al. ................. 526/266

FOREIGN PATENT DOCUMENTS

| JP | 4-115081 | | 10/1992 | | |
|---|---|---|---|---|---|
| JP | 405107306 A | * | 4/1993 | ........... | G01R/31/26 |
| JP | 410062490 A | * | 6/1998 | ........... | G01R/31/26 |
| JP | 410260228 A | * | 9/1998 | ........... | G01R/31/26 |
| JP | 02001099892 A | * | 4/2001 | ........... | G01R/31/26 |

* cited by examiner

Primary Examiner—Joseph J. Hail, III
Assistant Examiner—Anthony Ojini
(74) Attorney, Agent, or Firm—Flynn, Thiel, Boutell & Tanis, P.C.

(57) ABSTRACT

The invention can be easily applied to various contacts irrespective of the length of time needed for replacing ICs with other ICs relative to the contact. An IC handler comprises contact cleaning chips made of a material including polishing particles in the same shape as an ICs wherein a transfer attachment is removed from the contacts when contact cleaning chips are conveyed to the contacts so as to contact the contacts, then the contacts are taken out.

8 Claims, 3 Drawing Sheets

IC HANDLER AND CONTACT CLEANING METHOD

FIELD OF THE INVENTION

The invention relates to an IC handler for sorting ICs and a contact cleaning method, particularly a contact cleaning mechanism for cleaning contacts to which terminals of ICs contact and a contact cleaning method.

BACKGROUND OF THE INVENTION

FIG. 2 shows the construction of a conventional contact cleaning mechanism. An IC handler having the construction of a contact cleaning mechanism has been conventionally known as disclosed, for example, in Japanese Utility Model Laid-Open Publication No. 4-115081. An example of such a contact cleaning mechanism is shown along FIG. 2.

With the IC handler shown in FIG. 2, an IC 16 is sucked by an IC handler 15 and is conveyed onto a contact 18, while a pusher 17 presses the IC 16 to the contact 18, thereby measuring the IC 16. Upon completion of measurement of the IC 16, the pusher 17 rises so that an accommodation hand 19 sucks the IC 16 on the contact 18 to take out and convey it.

Thereafter, as shown in FIG. 3, the contact 18 has a transferred attached matter 20 thereon. When the contact 18 is cleaned, a cylinder 14 pushes out a brush 13 toward the contact 18 and retracts the brush 13 from the contact 18 one time or plural times. As a result, the contact 18 is brushed and cleaned. That is, the transferred attached matter 20 (hereinafter referred to simply as transfer attachment) comprises solder, plating or the like, which is melted from leads of the IC 16 and remains on the contact 18.

The contact to which a conventional contact cleaning mechanism is applied is limited only to flat type packaging contacts having terminals which extend in two directions, wherein each terminal has a shape of a horseshoe and is arranged in a shape of teeth of a comb, as viewed from the side thereof.

Furthermore, with the conventional contact cleaning mechanism, the contact is brushed during the replacement of an IC pith another IC on the contact, so that time for replacement of the IC with another IC is reduced to the utmost, and hence it is very difficult to employ the conventional contact cleaning mechanism.

SUMMARY OF THE INVENTION

In view of the foregoing circumstances, it is an object of the invention to provide an IC handler provided with a contact cleaning mechanism capable of being applied to various contacts which are present for every ICs having various packages and capable of being easily applied to the contacts irrespective of the length of time for replacement of the IC with another IC relative to the contacts, and a contact cleaning method thereof.

To achieve the above object, a first aspect of the invention is to provide an IC handler which is a horizontal conveyance type and includes contacts 4 to which ICs 10 contact, said IC handler comprises contact cleaning chips 1 disposed outside the contacts 4 and made of polishing particles in the same shape as the ICs 10, wherein a transfer attachment is removed from the contacts 4 when contact cleaning chips 1 are conveyed to the contacts 4 so as to contact the 4.

It is a second aspect of the invention to provide an IC handler first conveyance means 5 for transferring a plurality of ICs 10 from trays on which the ICs 10 are placed to a supply shuttle 6 which is on standby at a first delivering position P1, said supply shuttle 6 conveying the ICs 10 to a second delivering position P2, second conveyance means 7 for conveying the ICs 10 positioned at the second delivering position P2 to contacts 4 and conveying the ICs 10, and also conveying the ICs, upon completion of measurement of the ICs 10, to an accommodation shuttle 8 which is on standby at the second delivering position P2, said accommodation shuttle 8 conveying the ICs 10 to a third delivering position P3, and third conveyance means 9 for sorting and accommodating the ICs 10 in an empty tray, said IC handler further comprising a first accommodation stage 2 disposed in a movable range of the first conveyance means 5, a second accommodation stage 3 disposed in a movable range of the third conveyance means 9, and contact cleaning chips 1 made of a material including polishing particles in the same shape as the ICs 10, wherein a transfer attachment is removed from the contacts 4 when the contact cleaning chips 1 placed on the first accommodation stage 2 are conveyed to the contacts 4 so as to contact the contacts 4, and the contact cleaning chips 1 are accommodated in the second accommodation stage 3.

It is a third aspect of the invention to provide a contact cleaning method in an IC handler comprising first conveyance means 5 for transferring a plurality of ICs 10 from trays on which the ICs 10 are placed to a supply shuttle 6 which is on standby at a first delivering position P1, said supply shuttle 6 conveying the ICs 10 to a second delivering position P2, second conveyance means 7 for conveying the ICs 10 positioned at the second delivering position P2 to contacts 4 and conveying ICs 10, and also conveying the ICs, upon completion of measurement of the ICs 10, to an accommodation shuttle 8 which is on standby at the second delivering position P2, said accommodation shuttle 8 conveying the ICs 10 to a third delivering position P3, third conveyance means 9 for sorting and accommodating the ICs 10 in an empty tray, a first accommodation stage 2 disposed in a movable range of the first conveyance means 5, a second accommodation stage 3 disposed in a movable range of the third conveyance means 9, said method comprising the steps of placing contact cleaning chips 1 made of a material including polishing particles in the same shape as the ICs 10 to the first accommodation stage 2, transferring the contact cleaning chips 1 to the supply shuttle 6 which is on standby at the first delivering position P1 by the first conveyance means 5, conveying the contact cleaning chips 1 to the second accommodation stage 2 by the supply shuttle 6, conveying the contact cleaning chips 1 positioned at the second delivering position P2 to the contacts 4 so as to contact the contacts 4 by the second conveying means 7 so that the contact cleaning chips 1 remove a transfer attachment from the contacts 4, and also conveying the contact cleaning chips 1 removed the transfer attachment to the accommodation shuttle 8 which is on standby at the second delivering position P2, conveying the contact cleaning chips 1 to the third delivering position P3 by the accommodation shuttle 8, and accommodating the contact cleaning chips 1 in the second accommodation stage 3 by the third conveyance means 9.

A fourth aspect of the invention is an IC handler wherein the contacts 4 correspond to a CSP/BGA package type IC and the contact cleaning chips 1 correspond to the same CSP/BGA package type IC.

The reference numerals set forth above are provided for the convenience of understanding the invention with reference to the drawings but they do not limit the invention.

DETAILED DESCRIPTION OF THE PREFERRED EMBODIMENTS

Figure 1:
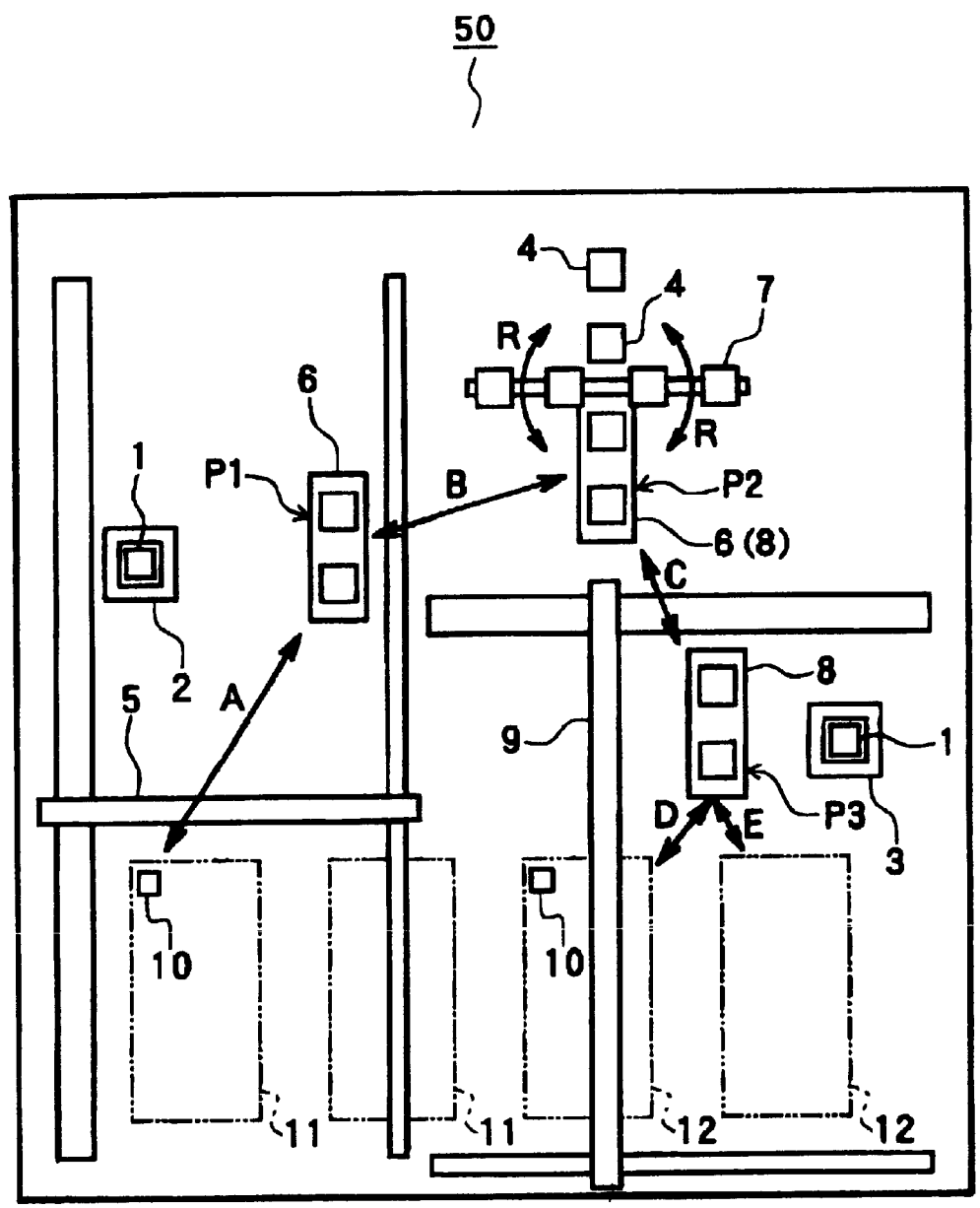
FIG. 1 is a plan view showing an IC handler according to the invention.
Figure 2:
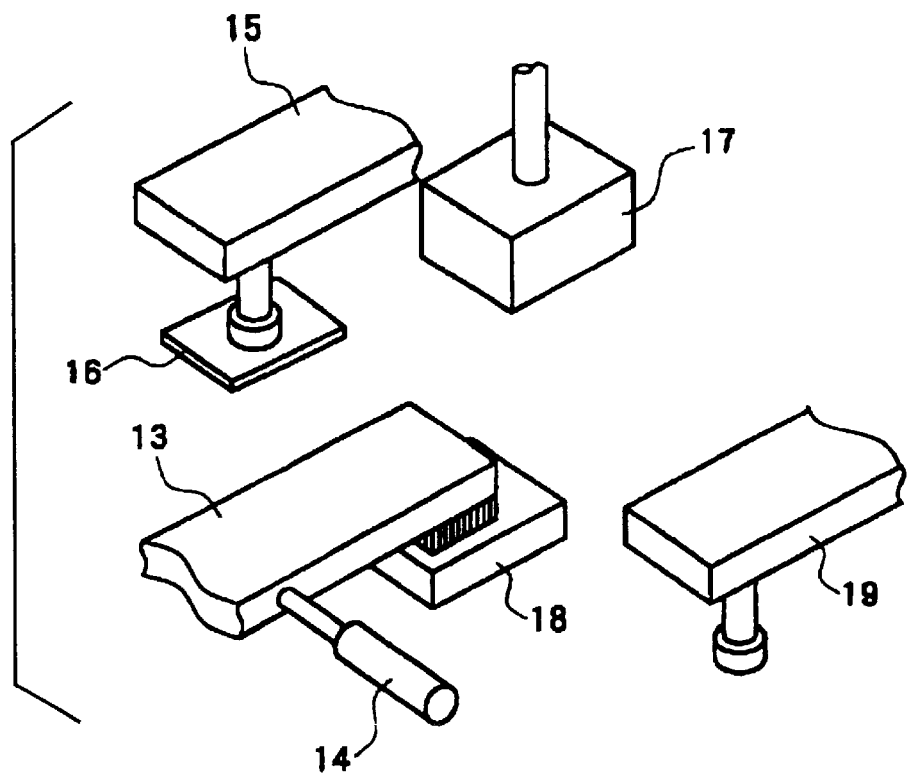
FIG. 2 is a view showing a construction of a conventional contact cleaning mechanism.
Figure 3:
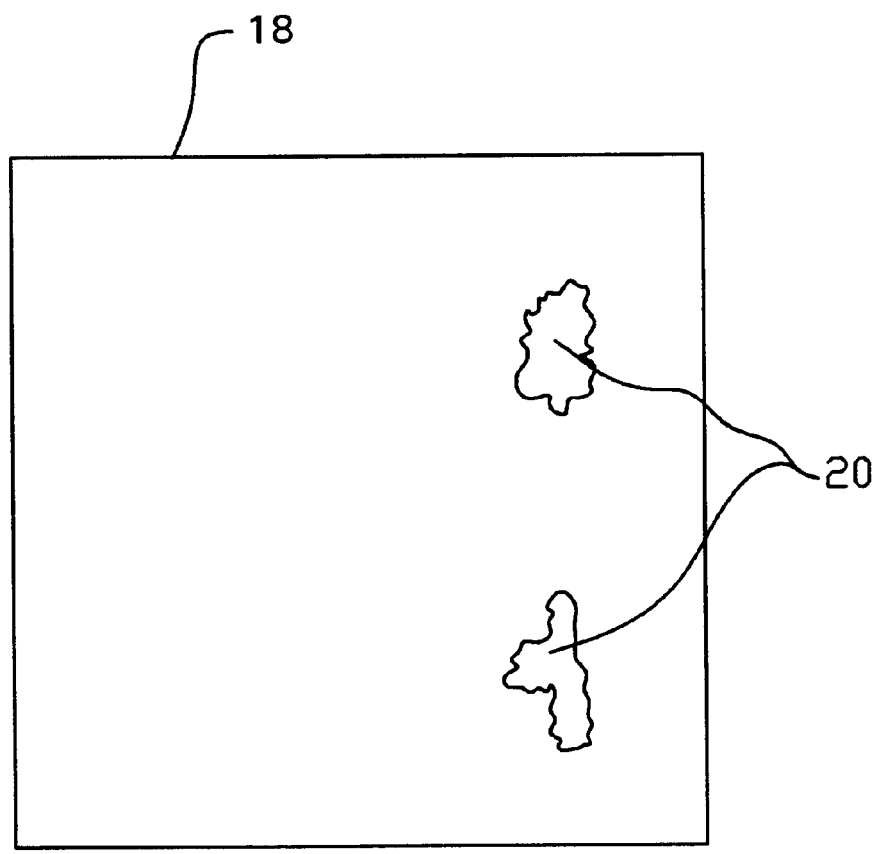
FIG. 3 is a view showing transfer attachment on a contact.

FIG. 1 is a plan view showing an IC handler 50 according to the invention. The IC handler 50 provided with a contact cleaning mechanism according to a preferred embodiment of the invention is described with reference to FIG. 1. The IC handler 50 comprises loaders 11 provided with a plurality of trays for placing a plurality of ICs 10 thereon, and unloaders 12 provided with a plurality of trays for sorting and accommodating the ICs 10 therein on the basis of measurement. Further, the IC handler 50 is provided with a supply hand 5 for freely conveying the ICs 10 between the trays of the loaders 11 and a predetermined delivering position P1, e.g. in the direction of an arrow A in FIG. 1, and an accommodation hand 9 for freely conveying the ICs 10 between the trays of the unloaders 12 and a predetermined delivering position P3, e.g. in the direction of arrows D or E in FIG. 1.

Further, the IC handler 50 is provided with a supply shuttle 6 for freely conveying the ICs 10 between the delivering position P1 and a predetermined delivering position P2, e.g., in the direction of an arrow B in FIG. 1, and an accommodation shuttle 8 for freely conveying the ICs 10 between the delivering positions P3 and P2, e.g., in the direction of an arrow C in FIG. 1. The IC handler 50 is provided with contacts 4 for measuring the ICs 10 and a measuring IC handler 7 for freely turning the ICs 10 between the contacts 4 and the second delivering position P2, e.g. in the direction of an arrow R in FIG. 1.

Still further, a supply side accommodation stage 2 is provided in a movable range of the supply hand 5, and contact cleaning chips 1 are placed on the supply side accommodation stage 2 to be freely taken out. Further, an accommodation side accommodation stage 3 is provided in the movable range of the accommodation hand 9 and used contact cleaning chips 1 are accommodated in the accommodation side accommodation stage 3.

The contact cleaning chips 1 are formed by molding a sheet made of a PET film coated with polishing particles into the shape of a flat type (outer lead type) package when the contacts 4 are, e.g. those for the flat type package. Further, for example, if the contacts 4 are, e.g. those for a CSP/BGA type package, the contact cleaning chips 1 are formed by molding a liquefied synthetic resin mixed with polishing particles into the shape of the CSP/BGA type package.

Since the IC handler 50 is constructed as mentioned above, the measurement of the ICs 10 is effected as follows. First, the first conveyance means 5 takes out the ICs 10 from the trays of the loaders 11 and conveys them in the direction of the arrow A. Then the first conveyance means delivers the ICs 10 at the first delivering position P1. The supply shuttle 6 conveys the thus received ICs 10 to the second delivering position P2 in the direction of the arrow B.

Then the measuring hand 7 receives the ICs 10 from the supply shuttle 6 positioned at the second delivering position P2, and conveys the ICs 10 to the contacts 4 and press them to the contacts 4. When the ICs 10 are pressed against the contacts 4, the measurement of the ICs 10 is started. Thereafter, the measuring hand 7 conveys the measured ICs 10 again to the second delivering position P2 and delivers the ICs 10 to the accommodation shuttle 8 which is positioned at the second delivering position P2 while replaced by the supply shuttle 6.

The accommodation shuttle 8 conveys the received ICs 10 to the third delivering position P3 where the accommodation hand 9 receives the ICs 10, then sorts and accommodates the ICs 10 on trays of the unloader 12 in the direction of the arrow D or E in response to the results of measurement.

When the foregoing processes are repeated, the ICs 10 are sequentially measured, sorted and accommodated. When this sorting operation is repeated, a transfer attachment such as solder, plating which was melted from leads of the ICs 10 is stuck to the terminals of the contacts 4. If many transfer attachments are stuck to the terminals of the contacts 4, proper measurement can not be effected due to the inferior contact. As a result, even if the ICs 10 are not defective products, they are measured as defective ones, resulting in deterioration of yield of the ICs 10, so that a cleaning operation for removing the transfer attachment from the terminals of the contacts 4 is required.

After the sorting operation is effected by a predetermined number, the procedure moves to an operation program serving as the cleaning operation. First, the supply hand 5 takes out the contact cleaning chips 1 from the supply side accommodation stage 2 and conveys them to the first delivering position P1 to deliver them to the supply shuttle 6. The supply shuttle 6 conveys the received contact cleaning chips 1 to the second delivering position P2. Then the second measuring hand 7 receives the contact cleaning chips 1 from the supply shuttle 6 positioned at the second delivering position P2 and conveys them to the contacts 4, and presses them onto the contacts 4. When the contact cleaning chips 1 are pressed against the contacts 4, polishing particles included in the contact cleaning chips 1 remove the transfer attachment from the terminals of the contacts 4.

Thereafter, the measuring hand 7 conveys the used contact cleaning chips 1 again to the second delivering position P2, and delivers them to the accommodation shuttle 8. The accommodation shuttle 8 conveys the received contact cleaning chips 1 to the third delivering position P3, and the third accommodation hand 9 receives the contact cleaning chips 1 conveyed to the second delivering position P2, and accommodates them in the accommodation side accommodation stage 3. The used contact cleaning chips 1 accommodated in the accommodation side accommodation stage 3 are appropriately collected, and new contact cleaning chips 1 are placed on the supply side accommodation stage 2. The cleaning operation is thus ended, and the foregoing sorting operation is resumed.

As mentioned in detail above, the IC handler 50 selectively employs the contact cleaning chips 1 conforming to the shapes of the contacts 4, and hence the contact cleaning chips 1 can clean various contacts 4 which are present for every ICs having various packages. Further, since operations during a cleaning operation are the same as those when ICs are normally measured, the invention can be easily applied to contacts irrespective of the length of time needed for replacement of an IC with another IC relative to the contacts 4.

In the preferred embodiment, conveying means for conveying the ICs are constituted by shuttles, hands, but an IC handler to which the invention is applied is not limited to these types. For example, the invention can be applied to a horizontal type IC handler.

As mentioned in detail above, according to the invention, when the contact cleaning chips conforming to the shapes of the contacts are selectively employed, various contacts which are present for every ICs of various packages can be cleaned. Further, since the operations during the cleaning operation are the same as those when the ICs are normally measured, the invention can be easily applied to various contacts irrespective of the length of time needed for replacement of an IC with another IC relative to the contacts.

Further, according to the fourth aspect of the invention, the IC handler can be used for CSP/BGA type ICs, which is very suitable.

What is claimed is:

1. An IC handler which is a horizontal conveyance type and includes contacts to which ICs contact, said IC handler comprising contact cleaning chips disposed outside the contacts and made of a material including polishing particles in the same shape as the ICs, wherein a transfer attachment is removed from the contacts when the contact cleaning chips are conveyed to the contacts so as to contact the contacts.

2. The IC handler according to claim 1, wherein the contacts correspond to a CSP/BGA package type IC and the contact cleaning chips correspond to the same CSP/BGA package type IC.

3. The IC handler according to claim 1, wherein the ICs are measured when the ICs are pressed into the contacts.

4. An IC handler comprising:
   a first conveyor for transferring a plurality of ICs from trays on which the ICs are placed to a supply shuttle which is on standby at a first delivering position;
   said supply shuttle conveying the ICs to a second delivering position;
   a second conveyor for conveying the ICs positioned at the second delivering position to contacts and conveying ICs, and also conveying the ICs, upon completion of measurement of the ICs, to an accommodation shuttle which is on standby at the second delivering position;
   said accommodation shuttle conveying the ICs to a third delivering position; and
   a third conveyor for sorting and accommodating the ICs in an empty tray;
   said IC handler further comprising:
      a first accommodation stage disposed in a movable range of the first conveyor;
      a second accommodation stage disposed in a movable range of the third conveyor; and
      contact cleaning chips made of a material including polishing particles in the same shape as the ICs, wherein a transfer attachment is removed from the contacts when the contact cleaning chips placed on the first accommodation stage are conveyed to the contacts so as to contact the contacts, and the contact cleaning chips are accommodated in the second accommodation stage.

5. The IC handler according to claim 4, wherein the contacts correspond to a CSP/BGA package type IC and the contact cleaning chips correspond to the same CSP/BGA package type IC.

6. The IC handler according to claim 4, wherein the ICs are measured when the ICs are pressed into the contacts.

7. A contact cleaning method in an IC handler comprising a first conveyor for transferring a plurality of ICs from trays on which the ICs are placed to a supply shuttle which is on standby at a first delivering position, said supply shuttle conveying the ICs to a second delivering position, a second conveyor for conveying the ICs positioned at the second delivering position so as to contact and convey ICs, and also convey the ICs, upon completion of measurement of the ICs, to an accommodation shuttle which is on standby at the second delivering position, said accommodation shuttle conveying the ICs to a third delivering position, a third conveyor for sorting and accommodating the ICs in an empty tray, a first accommodation stage disposed in a movable range of the first conveyor, a second accommodation stage disposed in a movable range of the third conveyor, said method comprising the steps of:
   placing contact cleaning chips made of a material including polishing particles in the same shape as the ICs to the first accommodation stage;
   transferring the contact cleaning chips to the supply shuttle which is on standby at the first delivering position by the first conveyor;
   conveying the contact cleaning chips to the second accommodation stage by the supply shuttle;
   conveying the contact cleaning chips positioned at the second delivering position to the contacts so as to contact the contacts by the second conveyor so that the contact cleaning chips remove a transfer attachment from the contacts, and also conveying the contact cleaning chips with the removed transfer attachment to the accommodation shuttle which is on standby at the second delivering position;
   conveying the contact cleaning chips to the third delivering position by the accommodation shuttle; and
   accommodating the contact cleaning chips in the second accommodation stage by the third conveyor.

8. An IC handler comprising:
   contacts for receiving ICs;
   contact cleaning chips separate from the contacts and comprising a material including polishing particles having a shape corresponding to the ICs;
   trays for transporting the ICs;
   a supply shuttle for receiving ICs;
   a first conveying device for transferring ICs from the trays to the supply shuttle;
   a second conveying device for receiving ICs from said supply shuttle and conveying ICs to said contacts for measurement; and
   an accommodation shuttle for receiving measured ICs from said second conveying device;
   a third conveyor for receiving ICs from the accommodation shuttle and placing the ICs in empty ones of the trays; and
   contact cleaning chips for accommodation on the contacts to clean the contacts and for removal from the contacts.

* * * * *